United States Patent
Zhang et al.

(10) Patent No.: US 10,833,290 B2
(45) Date of Patent: Nov. 10, 2020

(54) ENCAPSULATION METHOD OF ORGANIC LIGHT EMITTING DIODE DEVICE AND ENCAPSULATION STRUCTURE ENCAPSULATED USING SAME

(71) Applicant: WUHAN CHINA STAR OPTOELECTRONICS SEMICONDUCTOR DISPLAY TECHNOLOGY CO., LTD., Hubei (CN)

(72) Inventors: Ming Zhang, Hubei (CN); Hsianglun Hsu, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 16/330,092

(22) PCT Filed: Jan. 18, 2019

(86) PCT No.: PCT/CN2019/072379
§ 371 (c)(1),
(2) Date: Mar. 3, 2019

(87) PCT Pub. No.: WO2020/007033
PCT Pub. Date: Jan. 9, 2020

(65) Prior Publication Data
US 2020/0083476 A1    Mar. 12, 2020

(51) Int. Cl.
*H01L 51/52*    (2006.01)
*H01L 51/56*    (2006.01)

(52) U.S. Cl.
CPC ...... *H01L 51/5253* (2013.01); *H01L 51/5243* (2013.01); *H01L 51/5246* (2013.01);
(Continued)

(58) Field of Classification Search
CPC ............. H01L 51/5253; H01L 51/5243; H01L 51/5246; H01L 51/56; H01L 2251/303; H01L 2251/5338
(Continued)

(56) References Cited

U.S. PATENT DOCUMENTS

2015/0351167 A1    12/2015 Moro et al.
2016/0248042 A1    8/2016 Qian et al.
(Continued)

FOREIGN PATENT DOCUMENTS

CN    102237494 A    11/2011
CN    103744238 A    4/2014
(Continued)

*Primary Examiner* — Tu-Tu V Ho
(74) *Attorney, Agent, or Firm* — Mark M. Friedman

(57) ABSTRACT

An encapsulation method of an organic light emitting diode (OLED) device is provided. The encapsulation method includes steps of a substrate formed with the OLED device; forming at least an encapsulation film on a surface of the OLED device; and bonding a pre-formed barrier layer to an edge region of the encapsulation film. By bonding the pre-formed barrier layer to the edge region of the encapsulation film, the disclosure can achieve effects of improving an ability of moisture and oxygen resistance of the edge region of the OLED device, thereby improving reliability of encapsulation of the OLED device and prolonging lifetime of the OLED device.

14 Claims, 3 Drawing Sheets

(52) U.S. Cl.
CPC ........ *H01L 51/56* (2013.01); *H01L 2251/303* (2013.01); *H01L 2251/5338* (2013.01)

(58) Field of Classification Search
USPC .......................................................... 257/40
See application file for complete search history.

(56) References Cited

U.S. PATENT DOCUMENTS

2018/0102504 A1    4/2018  Liu
2019/0131567 A1*   5/2019  Li ...................... H01L 51/5253

FOREIGN PATENT DOCUMENTS

| CN | 104157799  | A  | 11/2014 |
| CN | 105810849  | A  | 7/2016  |
| WO | 2014007528 | A1 | 1/2014  |

* cited by examiner

ENCAPSULATION METHOD OF ORGANIC LIGHT EMITTING DIODE DEVICE AND ENCAPSULATION STRUCTURE ENCAPSULATED USING SAME

FIELD OF INVENTION

This disclosure relates to display technology, and more particularly to an encapsulation method of an organic light emitting diode device and an encapsulation structure encapsulated by the encapsulation method.

BACKGROUND OF INVENTION

A flexible organic light emitting diode (OLED) display is suitable for application in current type light emitting devices due to wide color gamut, high contrast, low energy consumption, bendability, and other characteristics. A flexible OLED display panel technology is the most competitive technology for display industry in a new generation of display devices and has become a very popular display device. However, lifetime of OLED components in flexible OLED display panels is an essential issue in development of the flexible OLED display panel. Therefore, excellent water and oxygen blocking properties of a thin film encapsulation process are particularly important for the flexible OLED display panels.

In a conventional thin film encapsulation process, generally, an inorganic layer, resistant to water and oxygen, is disposed on a surface of a OLED device, and is mainly prepared by an atomic layer deposition process, a plasma enhanced chemical vapor deposition process or a chemical vapor deposition process. Although an ability of the OLED device to resist water and oxygen can be improved, due to the use of a mask in the encapsulation process, particle problems occur in an edge region of the inorganic layer. The particle problems reduce a water and oxygen resistance ability of the edge region of the OLED device, so that reliability of the encapsulation process of the OLED device package is reduced, and the lifetime of the OLED device is reduced.

SUMMARY OF INVENTION

The solutions to solve the above-mentioned drawbacks is how to improves a water and oxygen resistance ability of an edge region of an OLED device, thereby improving reliability of an encapsulation of the OLED device and prolonging lifetime of the OLED device.

First, the disclosure provides an encapsulation method of an organic light emitting diode (OLED) device. The encapsulation method comprises steps of:
 providing a substrate formed with the OLED device;
 forming at least an encapsulation film on a surface of the OLED device;
 bonding a barrier layer to an edge region of the at least an encapsulation film, wherein the barrier layer is pre-formed;
 wherein the bonding process is a rolling bonding process or a vacuum bonding process; and
 wherein the barrier layer is a ring-shaped structure that surrounds the at least an encapsulation film.

According to the encapsulation method of the OLED device of the disclosure, the step of bonding the pre-formed barrier layer to the edge region of the at least an encapsulation film further comprises steps of: forming the barrier layer by a low temperature plasma enhanced chemical vapor deposition.

According to the encapsulation method of the OLED device of the disclosure, the barrier layer at least partially overlaps the at least an encapsulation film.

According to the encapsulation method of the OLED device of the disclosure, the barrier layer comprises an outer sidewall and an inner sidewall, the outer sidewall and the inner sidewall are oppositely disposed; and wherein the inner sidewall is disposed on a side of the barrier layer adjacent to the at least an encapsulation film, and a distance between the inner sidewall and the outer sidewall is between 0 to 100 micrometers.

According to the encapsulation method of the OLED device of the disclosure, the barrier layer is made of an inorganic material.

According to the encapsulation method of the OLED device of the disclosure, the barrier layer is made of silicon nitride or aluminum oxide.

According to the encapsulation method of the OLED device of the disclosure, the barrier layer at least partially overlaps the at least an encapsulation film.

According to the encapsulation method of the OLED device of the disclosure, the barrier layer comprises an outer sidewall and an inner sidewall, the outer sidewall and the inner sidewall are oppositely disposed; and wherein the inner sidewall is disposed on a side of the barrier layer adjacent to the at least an encapsulation film, and a distance between the inner sidewall and the outer sidewall is between 0 to 100 micrometers.

Secondly, the disclosure further provides an encapsulation method of an organic light emitting diode (OLED) device. The encapsulation method comprises steps of:
 providing a substrate formed with the OLED device;
 forming at least an encapsulation film on a surface of the OLED device;
 bonding a barrier layer to an edge region of the at least an encapsulation film, wherein the barrier layer is pre-formed.

According to the encapsulation method of the OLED device of the disclosure, the step of bonding the pre-formed barrier layer to the edge region of the at least an encapsulation film further comprises steps of: forming the barrier layer in advance by a low temperature plasma enhanced chemical vapor deposition.

According to the encapsulation method of the OLED device of the disclosure, the barrier layer is a ring-shaped structure for surrounding the at least an encapsulation film.

According to the encapsulation method of the OLED device of the disclosure, the barrier layer at least partially overlaps the at least an encapsulation film.

According to the encapsulation method of the OLED device of the disclosure, the barrier layer comprises an outer sidewall and an inner sidewall, the outer sidewall and the inner sidewall are oppositely disposed; and wherein the inner sidewall is disposed on a side of the barrier layer adjacent to the at least an encapsulation film, and a distance between the inner sidewall and the outer sidewall is between 0 to 100 micrometers.

According to the encapsulation method of the OLED device of the disclosure, the barrier layer is made of an inorganic material.

Correspondingly, the disclosure further provides an encapsulation structure of an organic light emitting diode (OLED) device, which comprises a substrate comprising the OLED device formed with the substrate; and at least an encapsulation film disposed on a surface of the OLED device.

A barrier layer is disposed on an edge region of the at least an encapsulation film for blocking moisture and oxygen, the barrier layer is pre-formed and is bonded to the edge region of the at least an encapsulation film.

According to the encapsulation structure of the OLED device of the disclosure, the barrier layer is a ring-shaped structure for surrounding the at least an encapsulation film.

According to the encapsulation structure of the OLED device of the disclosure, the barrier layer at least partially overlaps the at least an encapsulation film.

According to the encapsulation structure of the OLED device of the disclosure, the barrier layer comprises an outer sidewall and an inner sidewall, the outer sidewall and the inner sidewall are oppositely disposed; and wherein the inner sidewall is disposed on a side of the barrier layer adjacent to the at least an encapsulation film, and a distance between the inner sidewall and the outer sidewall is between 0 to 100 micrometers.

An encapsulation method of an organic light emitting diode (OLED) device is provided. The encapsulation method includes steps of a substrate formed with the OLED device; forming at least an encapsulation film on a surface of the OLED device; and bonding a pre-formed barrier layer to an edge region of the encapsulation film. By adhering the pre-formed barrier layer to the edge region of the encapsulation film, the disclosure can achieve effects of improving an ability of moisture and oxygen resistance of the edge region of the OLED device, thereby improving reliability of an encapsulation of the OLED device and prolonging lifetime of the OLED device.

DETAILED DESCRIPTION OF PREFERRED EMBODIMENTS

Figure 1:
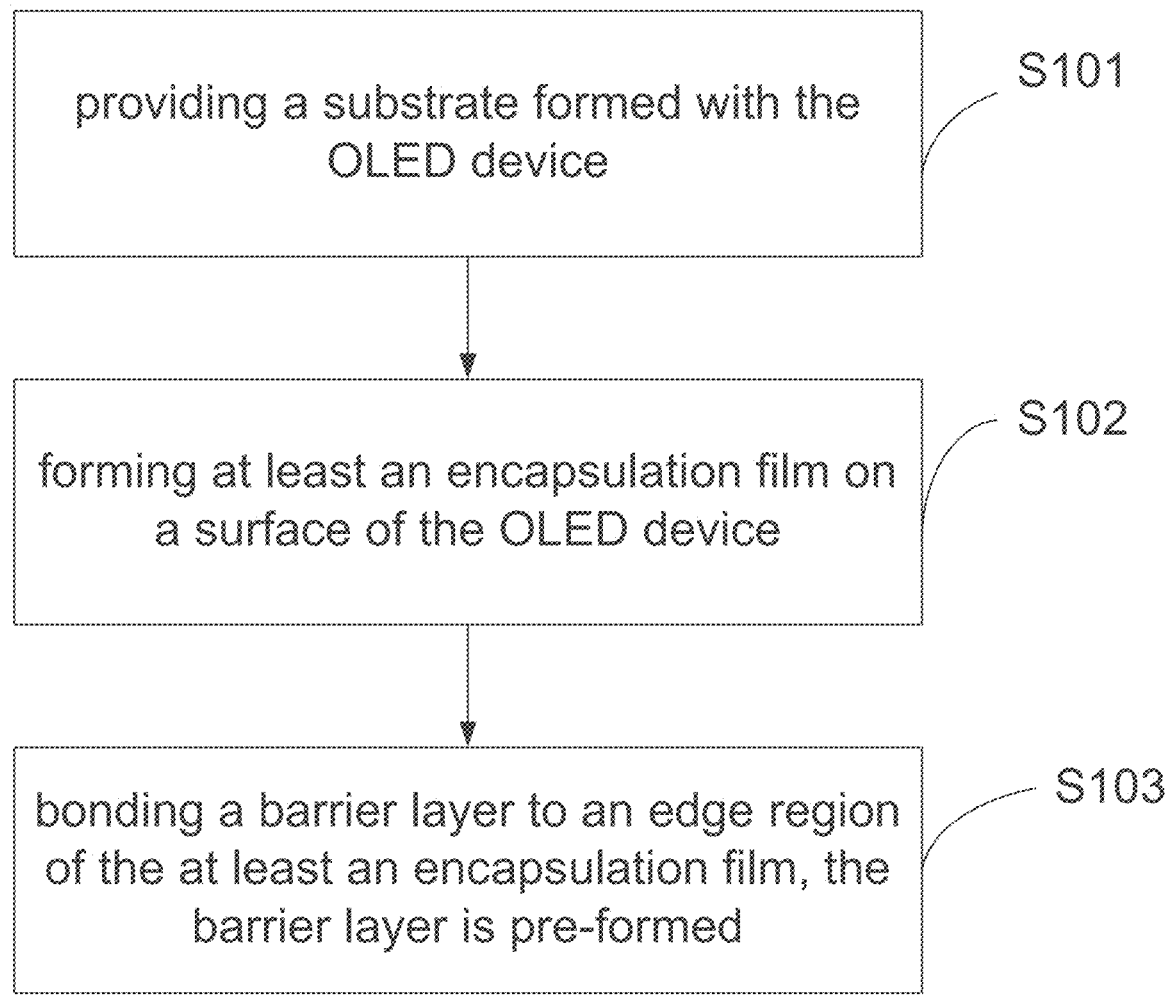
FIG. 1 is a flowchart of an encapsulation method of an organic light emitting diode (OLED) device according to an embodiment of this disclosure.

Referring to FIG. 1, a flowchart of an encapsulation method of an organic light emitting diode (OLED) device according to an embodiment of this disclosure is shown. The encapsulation method comprises following steps.

In step S101, providing a substrate formed with the OLED device.

In step S102, forming at least an encapsulation film on a surface of the OLED device.

In step S103, bonding a barrier layer to an edge region of the at least an encapsulation film. The barrier layer is pre-formed.

In the step S101, the substrate formed with the OLED device is provided. For example, a thin film transistor substrate is provided on which an OLED device is formed by a distillation process. Besides, the substrate is a flexible substrate, and a material of the substrate is polyetherimide (PEI), polyethylene terephthalate (PEN) or polyimide (PI), and the OLED device comprises an anode, a light-emitting layer, and a cathode laminated on a glass substrate.

In the step S102, the at least an encapsulation film is formed on the surface of the OLED device.

Specifically, the at least an encapsulation film is formed on the surface of the OLED device by using a thin film encapsulation process through using the glass substrate on which the OLED device has been formed in step S101. It should be noted that the encapsulation film at least partially covers the OLED device. Optionally, a plurality of the encapsulation films are stacked to form multiple sets of the encapsulation films, or only one set of the encapsulations film covers the OLED device, depending on the actual situation.

In step S103, the barrier layer is bonded to the edge region of the at least an encapsulation film. The barrier layer is pre-formed. For example, the OLED device in which at least one set of the encapsulation films have been formed in step S102 can be used to adhere the pre-formed barrier layer to the edge region of the encapsulation film by a bonding process to improve a water and oxygen resistance ability of the OLED device. Optionally, the pre-formed barrier layer can be attached to the edge region of the encapsulation film by a rolling bonding process.

Figure 2:
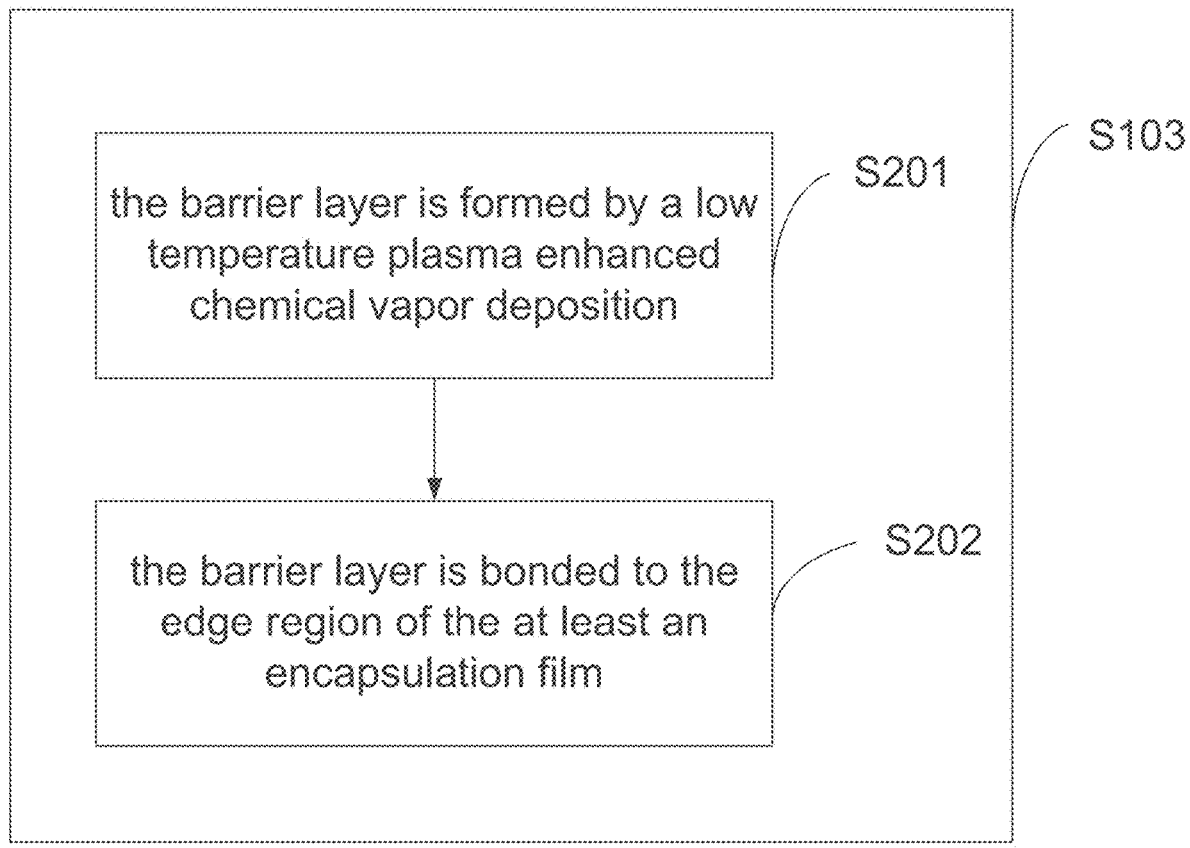
FIG. 2 is a schematic view of flowchart of a step S103 of the encapsulation method of the OLED device according to the embodiment of this disclosure.

Moreover, referring to FIG. 2, a schematic view of flowchart of the step S103 of the encapsulation method of the OLED device according to the embodiment of this disclosure is shown. As shown in FIG. 2, the step S103 further comprises following steps.

In step S201, the barrier layer is formed by a low temperature plasma enhanced chemical vapor deposition.

In step S202, the barrier layer is bonded to the edge region of the at least an encapsulation film.

For example, in the step S201, the barrier layer is formed in advance by the low temperature plasma enhanced chemical vapor deposition. After the encapsulation film is formed on the surface of the OLED device, the barrier layer is attached to the edge region of the encapsulation film. Besides, a size of the barrier layer is determined according to a size of the encapsulation film. Optionally, the bonding process is a rolling bonding process and the like to satisfy a soft-to-hard bonding method, and a bonding precision needs to reach ≤±50 micrometers.

Figure 3:
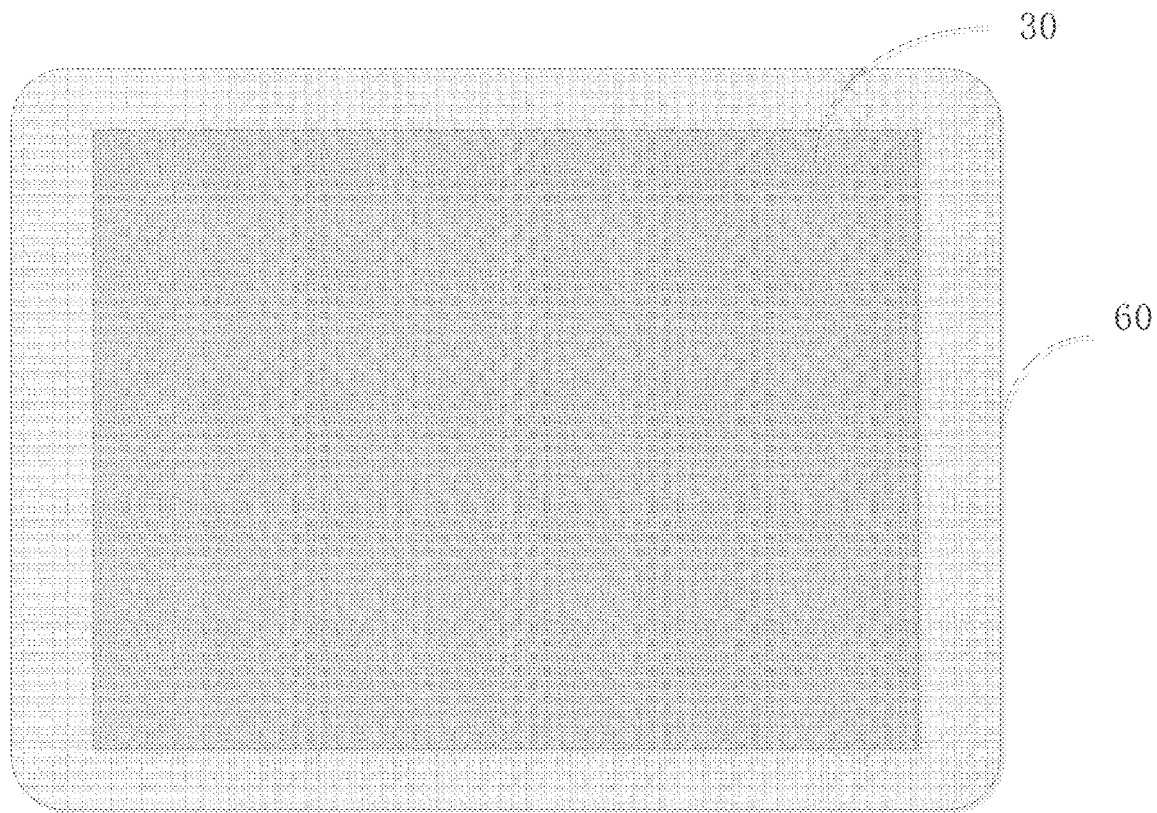
FIG. 3 is a schematic view of an encapsulation structure of an organic light emitting diode (OLED) device according to an embodiment of this disclosure.

Referring to FIG. 3, a schematic view of an encapsulation structure of an organic light emitting diode (OLED) device according to an embodiment of this disclosure is shown.

The barrier layer is a ring-shaped structure that surrounds the at least an encapsulation film.

Specifically, the barrier layer 60 is a ring-shaped structure. The barrier layer 60 is disposed on the edge region of the encapsulation film 30 to surround the encapsulation film 30. An effect of improving the water and oxygen resistance ability of the edge region of the encapsulation film 30 is achieved, thereby improving reliability of encapsulation of the OLED device 20 and prolonging lifetime of the OLED device 20.

Figure 4:
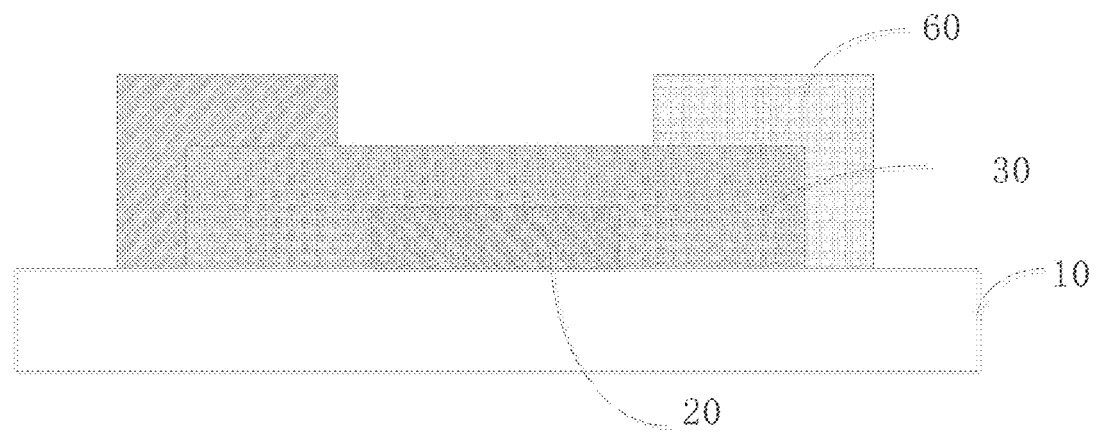
FIG. 4 is a cross-sectional schematic view of the encapsulation structure of the organic light emitting diode (OLED) device according to the embodiment of this disclosure.

Referring to FIG. 4, a cross-sectional schematic view of the encapsulation structure of the organic light emitting diode (OLED) device according to the embodiment of this disclosure is shown.

The barrier layer 60 at least partially overlaps the at least an encapsulation film 30.

The barrier layer comprises an outer sidewall and an inner sidewall, the outer sidewall (shown in the figure) and the inner sidewall (shown in the figure) are oppositely disposed. The inner sidewall is disposed on a side of the barrier layer 60 adjacent to the at least an encapsulation film 30, and a distance between the inner sidewall and the outer sidewall is between 0 to 100 micrometers.

For example, the barrier layer 60 at least partially covers a non-display area (not shown) of the substrate 10 corresponding to a region of the encapsulation film 30, so that an amount of adhesion of the barrier layer 60 to the encapsulation film 30 increases, and the water and oxygen resistance ability of the encapsulation film 30 further improves. The effect of improving the water and oxygen resistance ability of the OLED device 20 is achieved, thereby improving reliability of encapsulation of the OLED device 20 and prolonging lifetime of the OLED device 20. The distance between the inner sidewall and the outer sidewall of the barrier layer 60 is between 0 to 100 micrometers. Preferably, the distance between the inner sidewall and the outer sidewall is 100 micrometers.

It should be noted that the substrate 10 on which the OLED device 20 is formed is cut after bonding the pre-formed barrier layer to the edge region of the at least an encapsulation film. Besides, the substrate 10 on which the OLED device 20 is formed includes an effective area and a cutting area.

In a specific embodiment, an encapsulation film is formed on the OLED device, and then the pre-formed barrier layer 60 is attached to the edge region of the encapsulation film 30, and finally the substrate 10 is cut according to a pre-divided effective area and a cutting area. Alternatively, the substrate 10 is cut by a die cutting method to preserve the effective area of the substrate.

A material of the barrier layer 60 is an inorganic material.

The material of the barrier layer 60 is silicon nitride or aluminum oxide.

The bonding process is a rolling bonding process or a vacuum bonding process

The encapsulation film 30 comprises a first inorganic layer, an organic layer and a second inorganic layer which are arranged in a laminated configuration.

In this embodiment, by bonding the pre-formed barrier layer to the edge region of the encapsulation film, the disclosure can achieve effects of improving an moisture and oxygen resistance ability of the edge region of the OLED device, thereby improving reliability of encapsulation of the OLED device and prolonging lifetime of the OLED device.

Correspondingly, the disclosure further provides an encapsulation structure of an organic light emitting diode (OLED) device.

Referring to FIG. 4, the encapsulation structure of the OLED device comprises a substrate 10 comprising the OLED device 20 formed with the substrate 10, and at least an encapsulation film 30 disposed on a surface of the OLED device 20.

A barrier layer 60 is disposed on an edge region of the at least an encapsulation film 30 for blocking moisture and oxygen, the barrier layer 60 is pre-formed and is bonded to the edge region of the at least an encapsulation film 30.

Specifically, the substrate 10 is a flexible substrate, and a material of the substrate is polyetherimide (PEI), polyethylene terephthalate (PEN) or polyimide (PI), and the OLED device comprises an anode, a light-emitting layer, and a cathode laminated on a glass substrate. At least an encapsulation film 30 is disposed on a surface of the OLED device 20.

The encapsulation film 30 includes a first inorganic layer, an organic layer, and a second inorganic layer (not shown) stacked in a laminated configuration. A barrier layer 60 for blocking water and oxygen is disposed on an edge region of the encapsulation film 30. Preferably, the barrier layer 60 is pre-formed and disposed on the edge region of the encapsulation film 30, for example, by a rolling bonding process.

For the method of forming the barrier layer 60, please refer to the previous embodiment, and details are not described herein.

The barrier layer 60 is a ring-shaped structure that surrounds the at least an encapsulation film 30.

Specifically, the barrier layer 60 is a ring-shaped structure. The barrier layer 60 is disposed on the edge region of the encapsulation film 30 to surround the encapsulation film 30. An effect of improving the water and oxygen resistance ability of the edge region of the encapsulation film 30 is achieved, thereby improving reliability of encapsulation of the OLED device 20 and prolonging lifetime of the OLED device 20.

The barrier layer 60 at least partially overlaps the at least an encapsulation film 30.

The barrier layer comprises an outer sidewall and an inner sidewall, the outer sidewall and the inner sidewall are oppositely disposed. The inner sidewall is disposed on a side of the barrier layer 60 adjacent to the at least an encapsulation film 30, and a distance between the inner sidewall and the outer sidewall is between 0 to 100 micrometers.

Specifically, the substrate 10 comprises a display area (not shown) and a non-display area (not shown). The barrier layer 60 at least partially covers a non-display area of the substrate 10 corresponding to a region of the encapsulation film 30, so that an amount of adhesion of the barrier layer 60 to the encapsulation film 30 increases, and the water and oxygen resistance ability of the encapsulation film 30 further improves. The effect of improving the water and oxygen resistance ability of the OLED device 20 is achieved, thereby improving reliability of encapsulation of the OLED device 20 and prolonging lifetime of the OLED device 20. The distance between the inner sidewall and the outer sidewall of the barrier layer 60 is between 0 to 100 micrometers. Preferably, the distance between the inner sidewall and the outer sidewall is 100 micrometers.

In this embodiment, the barrier layer 60 is disposed on the edge region of the encapsulation film 30 to surround the encapsulation film 30. An effect of improving the water and oxygen resistance ability of the edge region of the encapsulation film 30 is achieved, thereby improving reliability of encapsulation of the OLED device 20 and prolonging lifetime of the OLED device 20.

The encapsulation method and the encapsulation structure of the OLED device provided by the embodiments of the disclosure are described in detail above. The principles and embodiments of the disclosure are described in the above embodiments. The above description of the embodiments is merely for the purpose of understanding the disclosure. This disclosure has been described with preferred embodiments thereof, and it is understood that many changes and modifications to the described embodiment can be carried out without departing from the scope and the spirit of the invention that is intended to be limited only by the appended claims.

The invention claimed is:

1. An encapsulation method of an organic light emitting diode (OLED) device, comprising steps of:
   providing a substrate formed with the OLED device;
   forming at least an encapsulation film on a surface of the OLED device;
   bonding a barrier layer to an edge region of the at least an encapsulation film, wherein the barrier layer is pre-formed;
   wherein the bonding process is a rolling bonding process or a vacuum bonding process; and wherein the barrier layer is a ring-shaped structure that surrounds the at least an encapsulation film.

2. The encapsulation method of the OLED device according to claim 1, wherein the step of bonding the pre-formed barrier layer to the edge region of the at least an encapsulation film further comprises steps of:
   forming the barrier layer by a low temperature plasma enhanced chemical vapor deposition.

3. The encapsulation method of the OLED device according to claim 2, wherein the barrier layer at least partially overlaps the at least an encapsulation film.

4. The encapsulation method of the OLED device according to claim 3, wherein the barrier layer comprises an outer sidewall and an inner sidewall, the outer sidewall and the inner sidewall are oppositely disposed; and wherein the inner sidewall is disposed on a side of the barrier layer adjacent to the at least an encapsulation film, and a distance between the inner sidewall and the outer sidewall is between 0 to 100 micrometers.

5. The encapsulation method of the OLED device according to claim 1, wherein the barrier layer is made of an inorganic material.

6. The encapsulation method of the OLED device according to claim 5, wherein the barrier layer is made of silicon nitride or aluminum oxide.

7. The encapsulation method of the OLED device according to claim 1, wherein the barrier layer at least partially overlaps the at least an encapsulation film.

8. The encapsulation method of the OLED device according to claim 7, wherein the barrier layer comprises an outer sidewall and an inner sidewall, the outer sidewall and the inner sidewall are oppositely disposed; and wherein the inner sidewall is disposed on a side of the barrier layer adjacent to the at least an encapsulation film, and a distance between the inner sidewall and the outer sidewall is between 0 to 100 micrometers.

9. The encapsulation method of the OLED device according to claim 1, wherein the step of bonding the pre-formed barrier layer to the edge region of the at least an encapsulation film further comprises steps of:
   forming the barrier layer by a low temperature plasma enhanced chemical vapor deposition.

10. The encapsulation method of the OLED device according to claim 9, wherein the barrier layer is a ring-shaped structure for surrounding the at least an encapsulation film.

11. The encapsulation method of the OLED device according to claim 10, wherein the barrier layer at least partially overlaps the at least an encapsulation film.

12. The encapsulation method of the OLED device according to claim 11, wherein the barrier layer comprises an outer sidewall and an inner sidewall, the outer sidewall and the inner sidewall are oppositely disposed; and wherein the inner sidewall is disposed on a side of the barrier layer adjacent to the at least an encapsulation film, and a distance between the inner sidewall and the outer sidewall is between 0 to 100 micrometers.

13. An encapsulation method of an organic light emitting diode (OLED) device, comprising steps of:
   providing a substrate formed with the OLED device;
   forming at least an encapsulation film on a surface of the OLED device; and
   bonding a barrier layer to an edge region of the at least an encapsulation film, wherein the barrier layer is pre-formed.

14. The encapsulation method of the OLED device according to claim 13, wherein the barrier layer is made of an inorganic material.

* * * * *

UNITED STATES PATENT AND TRADEMARK OFFICE
CERTIFICATE OF CORRECTION

PATENT NO. : 10,833,290 B2
APPLICATION NO. : 16/330092
DATED : November 10, 2020
INVENTOR(S) : Ming Zhang and Hsianglun Hsu Page 1 of 1

It is certified that error appears in the above-identified patent and that said Letters Patent is hereby corrected as shown below:

On the Title Page

Item (30) Foreign Application Priority Data should read:
"July 5, 2018 (CN) 201810732198.0"

Signed and Sealed this
Twelfth Day of January, 2021

Andrei Iancu
*Director of the United States Patent and Trademark Office*